United States Patent
Sogawa et al.

(10) Patent No.: US 8,106,691 B2
(45) Date of Patent: Jan. 31, 2012

(54) PHASE ADJUSTMENT CIRCUIT

(75) Inventors: Kazuaki Sogawa, Osaka (JP); Masayoshi Kinoshita, Osaka (JP); Yuji Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/206,182

(22) Filed: Aug. 9, 2011

(65) Prior Publication Data

US 2011/0291715 A1 Dec. 1, 2011

Related U.S. Application Data

(63) Continuation of application No. PCT/JP2009/003305, filed on Jul. 14, 2009.

(30) Foreign Application Priority Data

Feb. 26, 2009 (JP) .................................. 2009-044678

(51) Int. Cl.
*H03L 7/06* (2006.01)
(52) U.S. Cl. ........................................ 327/156; 327/147
(58) Field of Classification Search .................. 327/148, 327/157
See application file for complete search history.

(56) References Cited

U.S. PATENT DOCUMENTS

| | | | |
|---|---|---|---|
| 5,969,552 A | 10/1999 | Lee et al. | |
| 7,368,966 B2* | 5/2008 | Hur | 327/175 |
| 7,489,171 B2* | 2/2009 | Song | 327/158 |
| 7,859,316 B2* | 12/2010 | Choi | 327/158 |
| 7,916,821 B2* | 3/2011 | Li et al. | 375/373 |
| 8,005,180 B2* | 8/2011 | Fujinuma et al. | 375/371 |
| 2003/0219088 A1* | 11/2003 | Kwak | 375/376 |
| 2004/0066873 A1* | 4/2004 | Cho et al. | 375/376 |
| 2005/0093600 A1* | 5/2005 | Kwak | 327/161 |
| 2005/0141334 A1 | 6/2005 | Jeong | |
| 2006/0001494 A1* | 1/2006 | Garlepp et al. | 331/2 |
| 2009/0296878 A1* | 12/2009 | Tsai | 377/47 |
| 2011/0001527 A1* | 1/2011 | Lee | 327/158 |

FOREIGN PATENT DOCUMENTS

| | | |
|---|---|---|
| JP | 2000-244311 | 9/2000 |
| JP | 2003-008435 | 1/2003 |

* cited by examiner

*Primary Examiner* — Lincoln Donovan
*Assistant Examiner* — Adam Houston
(74) *Attorney, Agent, or Firm* — McDermott Will & Emery LLP

(57) ABSTRACT

In a phase adjustment circuit that divides the frequency of a double-frequency clock to obtain a 50% duty-cycle clock, a first ½ frequency division circuit having a phase inversion function generates an intermediate reference clock apart in phase from both a phase reference clock and a phase-adjusted clock. A first phase control circuit controls the phase of the intermediate reference clock to be in a desired phase state with respect to the phase reference clock. A second phase control circuit controls the phase of the phase-adjusted clock to be in a desired phase state with respect to the intermediate reference clock. Thus, when the phase-adjusted clock is adjusted to be close in phase to the phase reference clock, the phase difference between these clocks can be determined correctly and stably even if it varies due to clock jitter.

6 Claims, 11 Drawing Sheets

PHASE ADJUSTMENT CIRCUIT

CROSS-REFERENCE TO RELATED APPLICATION

This is a continuation of PCT International Application PCT/JP2009/003305 filed on Jul. 14, 2009, which claims priority to Japanese Patent Application No. 2009-044678 filed on Feb. 26, 2009. The disclosures of these applications including the specifications, the drawings, and the claims are hereby incorporated by reference in their entirety.

BACKGROUND

The present disclosure relates to improvement in a phase adjustment circuit that generates a phase-adjusted clock having a predetermined phase difference from a phase reference clock, which may be an input clock, etc. used as the reference for phase adjustment, and outputs the phase-adjusted clock.

In general, as one of the simplest techniques for generating a clock having a duty cycle of 50%, known is a technique where a clock having a frequency twice as high as the frequency of a clock for which the duty cycle of 50% is necessary is generated and then the frequency of the double-frequency clock is divided by a ½ frequency division circuit to obtain a 50% duty-cycle clock.

The output clock of the ½ frequency division circuit has two phase states different by 180° from each other depending on the initial state of the ½ frequency division circuit. Therefore, when the above technique is applied to a phase adjustment circuit that generates a phase-adjusted clock having a predetermined phase difference from a phase reference clock, the phase of the clock output from the ½ frequency division circuit will be in either one of the two states depending on the initial state of the ½ frequency division circuit and thus be uncertain with respect to the phase reference clock. As a result, the phase difference of the phase-adjusted clock from the phase reference clock may possibly change by 180° every time the phase adjustment circuit starts up. Note that, when a clock having a frequency twice as high as the phase reference clock is generated, the clock has rising edges at dual phase positions with respect to the phase reference clock. Therefore, even if the initial state of the ½ frequency division circuit is fixed by reset control, etc., the output phase of the 1/2 frequency division circuit with respect to the phase reference clock will vary depending on which one of the rising edges at the two phase positions is input first.

To solve the above problem that the output phase of the ½ frequency division circuit is uncertain with respect to the phase reference clock, phase comparison is conventionally performed between the output clock of the ½ frequency division circuit and the phase reference clock, and the output phase of the ½ frequency division circuit is inverted if the phase comparison result is not in a desired phase relationship, whereby the phase relationship between the phase reference clock and the output clock of the ½ frequency division circuit is kept constant. The configuration of a phase adjustment circuit that generates a phase-adjusted clock having a duty cycle of 50% using the conventional technique described above will be described with reference to FIG. 10.

As shown in FIG. 10, the phase adjustment circuit that generates a 50% duty-cycle phase-adjusted clock includes: a multiphase clock-generation circuit 10 that generates multiphase clocks having a frequency twice as high as a phase reference clock 1; a selection circuit 20 that selects one of the multiphase clocks based on a phase selection signal 2 and outputs the result as a selected clock 3; a ½ frequency division circuit 50, having a phase inversion function, that divides the frequency of the selected clock 3 by two and outputs the result as a phase-adjusted clock 4; and a phase control circuit 70 that controls the output phase of the ½ frequency division circuit 50 having the phase inversion function so that the phase reference clock 1 and the phase-adjusted clock 4 are in a phase relationship based on the phase selection signal 2.

In FIG. 10, also, the ½ frequency division circuit 50 having the phase inversion function includes: a ½ frequency divider 51 that divides the frequency of the selected clock 3 by two and outputs a ½-frequency selected clock 52; an inverter 53 that generates an inverted clock of the ½-frequency selected clock 52; and a selector 54 that selects either one of the ½-frequency selected clock 52 and its inverted clock and outputs the result as the phase-adjusted clock 4.

The phase control circuit 70 includes: a phase comparator 71 that compares phases between the phase reference clock 1 and the ½-frequency selected clock 52 and determines whether the phase of the ½-frequency selected clock 52 with respect to the phase reference clock 1 is in the range of 0°-180° or in the range of 180°-360°; and a controller 72 that controls the selector 54 to select the ½-frequency selected clock 52 if the comparison result is in a phase range based on the phase selection signal 2, or otherwise select the inverted clock of the ½-frequency selected clock 52, and output the selected clock as the phase-adjusted clock 4.

The operation of the phase adjustment circuit that generates the 50% duty-cycle phase-adjusted clock 4 shown in FIG. 10 will be described. Assume herein that a four-phase clock generation circuit is used as an example of the multiphase clock-generation circuit 10.

First, the four-phase clock generation circuit 10 generates four-phase clocks having a frequency twice as high as the phase reference clock 1. The selection circuit 20 then selects one of the four-phase clocks based on the phase selection signal 2 as the selected clock 3. The four-phase clocks are clocks having phases equally spaced from each other by a quarter of a half cycle of the phase reference clock 1. By changing the phase selection signal 2, four-stage phase adjustment is possible. In FIGS. 11A and 11B, examples of the phase reference clock 1, the four-phase clocks, and the selected clock 3 obtained when clock [1] is selected among the four-phase clocks are shown.

Thereafter, the ½ frequency divider 51 divides the frequency of the selected clock 3 selected by the selection circuit 20 by two, to generate the ½-frequency selected clock 52. At this time, it is uncertain whether the phase of the ½-frequency selected clock 52 with respect to the phase reference clock 1 is in the range of 0°-180° or in the range of 180°-360°, which depends on the initial state of the ½ frequency divider 51 and the input timing of the selected clock 3. FIG. 11A shows the case where the phase of the ½-frequency selected clock 52 is in the range of 0°-180° with respect to the phase reference clock 1, and FIG. 11B shows the case where the phase of the ½-frequency selected clock 52 is in the range of 180°-360° with respect to the phase reference clock 1.

In view of the above, the phase comparator 71 of the phase control circuit 70 compares phases between the phase reference clock 1 and the ½-frequency selected clock 52 and determines whether the phase of the ½-frequency selected clock 52 with respect to the phase reference clock 1 is in the range of 0°-180° or in the range of 180°-360°. The controller 72 of the phase control circuit 70 controls the selector 54 to select the ½-frequency selected clock 52 if the comparison result is in the phase range based on the phase selection signal 2, or otherwise select the inverted clock of the ½-frequency selected clock 52.

For example, assume that the phase of the ½-frequency selected clock 52 with respect to the phase reference clock 1 is in the range of 0°-180°. In this case, the controller 72 of the phase control circuit 70 controls the selector 54 to output the ½-frequency selected clock 52 as it is (non-inverted clock) as the phase-adjusted clock 4 if the phase selection signal 2 indicates control in the range of 0°-180°, or output the inverted clock of the ½-frequency selected clock 52 as the phase-adjusted clock 4 if the phase selection signal 2 indicates control in the range of 180°-360°. FIG. 11A shows two forms of the phase-adjusted clock 4 obtained when controlled to be in the phase range of 0°-180° and in the phase range of 180°-360° in the case where the phase of the ½-frequency selected clock 52 is in the range of 0°-180° with respect to the phase reference clock 1. FIG. 11B shows two forms of the phase-adjusted clock 4 as described above in the case where the phase of the ½-frequency selected clock 52 is in the range of 180°-360° with respect to the phase reference clock 1.

With the operation of the phase control circuit 70 described above, the phase adjustment range of the phase-adjusted clock 4 with respect to the phase reference clock 1 is controlled to be in the phase range selected based on the phase selection signal 2, irrespective of the initial state of the ½ frequency divider 51 and the timing of the input clock.

In other words, the phase adjustment circuit can adopt the technique of generating a double-frequency clock and dividing the frequency of the clock by two to obtain a 50% duty-cycle clock, and yet can generate the phase-adjusted clock without being affected by the initial state of the ½ frequency division circuit and the timing of the input clock into the ½ frequency division circuit.

Note that Japanese Patent Publication No. 2000-244311 discloses, in its clock switch adjustment method, the technique of comparing phases between the output clock of the ½ frequency division circuit and the reference clock and inverting the output phase of the ½ frequency division circuit if the phase comparison result is not in a desired phase relationship, thereby controlling the output phase of the ½ frequency division circuit to be in a desired phase state.

SUMMARY

The conventional phase adjustment circuit that generates a 50% duty-cycle phase-adjusted clock has the following problem. In the case of making adjustment of the phase-adjusted clock to be close in phase to the phase reference clock, the higher the clock frequency and the higher the phase resolution, the smaller the phase difference between the phase reference clock and the phase-adjusted clock becomes. Therefore, if the phase difference varies due to clock jitter, the determination of the phase relationship between the phase reference clock and the phase-adjusted clock becomes unstable in the phase control circuit, resulting in repetition of the phase inversion operation of the phase-adjusted clock.

To solve the conventional problem described above, it is an objective of the present disclosure to provide a phase adjustment circuit capable of solving the problem of instability in phase determination by the phase control circuit and generating a 50% duty-cycle phase-adjusted clock stably even when the phase resolution is enhanced.

To attain the above objective, according to the present disclosure, an intermediate reference clock apart in phase from both the phase reference clock and the phase-adjusted clock is generated, and the phase of the intermediate reference clock is controlled so that the intermediate reference clock and the phase reference clock are in a desired phase relationship. Subsequently, the phase of the phase-adjusted clock is controlled so that the intermediate reference clock and the phase-adjusted clock are in a desired phase relationship. In this way, the phase of the phase-adjusted clock with respect to the phase reference clock is controlled indirectly via the intermediate reference clock without direct comparison of phases between the phase reference clock and the phase-adjusted clock.

More specifically, the phase adjustment circuit of the present disclosure includes: a multiphase clock-generation circuit configured to generate multiphase clocks having a frequency twice as high as the frequency of a reference clock; a first selection circuit configured to select one of the multiphase clocks based on a phase selection signal and output the one as a selected clock; a second selection circuit configured to select a clock, among the multiphase clocks, apart in phase from both the reference clock and the selected clock and output the clock as an intermediate clock; a first ½ frequency division circuit having a phase inversion function configured to divide the frequency of the intermediate clock by two and output the resultant clock as an intermediate reference clock; a second ½ frequency division circuit having a phase inversion function configured to divide the frequency of the selected clock and output the resultant clock as a phase-adjusted clock; a first phase control circuit configured to control the output phase of the first ½ frequency division circuit having the phase inversion function that generates the intermediate reference clock so that the reference clock and the intermediate reference clock are in a phase relationship based on the phase selection signal; and a second phase control circuit configured to control the output phase of the second ½ frequency division circuit having the phase inversion function that generates the phase-adjusted clock so that the intermediate reference clock and the phase-adjusted clock are in a phase relationship based on the phase selection signal.

In the phase adjustment circuit described above, preferably, the first ½ frequency division circuit having the phase inversion function includes a first ½ frequency divider configured to divide the intermediate clock by two to generate a ½-frequency intermediate clock, an inverter configured to generate an inverted clock of the ½-frequency intermediate clock, and a selector configured to select either one of the ½-frequency intermediate clock and the inverted clock of the ½-frequency intermediate clock based on the phase selection signal and output the selected one as the intermediate reference clock, the second ½ frequency division circuit having the phase inversion function includes a second ½ frequency divider configured to divide the selected clock by two to generate a ½-frequency selected clock, an inverter configured to generate an inverted clock of the ½-frequency selected clock, and a selector configured to select either one of the ½-frequency selected clock and the inverted clock of the ½-frequency selected clock based on the phase selection signal and output the selected one as the phase-adjusted clock, the first phase control circuit includes a phase comparator configured to compare phases between the reference clock and the ½-frequency intermediate clock, and a controller configured to control an inversion control signal for the first ½ frequency division circuit having the phase inversion function so that the ½-frequency intermediate clock is output if the phase comparison result from the phase comparator is in the phase relationship based on the phase selection signal, or otherwise the inverted clock of the ½-frequency intermediate clock is output, as the intermediate reference clock, and the second phase control circuit includes a phase comparator configured to compare phases between the intermediate reference clock and the ½-frequency selected clock, and a controller configured to control an inversion control signal for the second ½ frequency division circuit having the phase inversion function so that the ½-frequency selected clock is output if the phase comparison result from the phase comparator is in the phase relationship based on the phase selection signal, or otherwise the inverted clock of the ½-frequency selected clock is output, as the phase-adjusted clock.

In the phase adjustment circuit described above, preferably, the first ½ frequency division circuit having the phase inversion function includes a D-type flipflop configured to receive the intermediate clock as a clock signal and supply its output as the intermediate reference clock, and an EX-NOR circuit configured to receive the output of the D-type flipflop and an inversion control signal as its inputs and have an output connected to a data input of the D-type flipflop, the second ½ frequency division circuit having the phase inversion function includes a D-type flipflop configured to receive the selected clock as a clock signal and supply its output as the phase-adjusted clock, and an EX-NOR circuit configured to receive the output of the D-type flipflop and an inversion control signal as its inputs and have an output connected to a data input of the D-type flipflop, the first phase control circuit includes a phase comparator configured to compare phases between the reference clock and the intermediate reference clock, and a controller configured to perform phase inversion control for the intermediate reference clock, by supplying a signal having a pulse width equal to the period of the intermediate clock as the inversion control signal to the first ½ frequency division circuit having the phase inversion function, only when the phase comparison result from the phase comparator is not in the phase relationship based on the phase selection signal, and the second phase control circuit includes a phase comparator configured to compare phases between the intermediate reference clock and the phase-adjusted clock, and a controller configured to perform phase inversion control for the phase-adjusted clock, by supplying a signal having a pulse width equal to the period of the selected clock as the inversion control signal to the second ½ frequency division circuit having the phase inversion function, only when the phase comparison result from the phase comparator is not in the phase relationship based on the phase selection signal.

In the phase adjustment circuit described above, preferably, the second ½ frequency division circuit having the phase inversion function includes a second ½ frequency divider configured to divide the selected clock by two to generate a ½-frequency selected clock, an inverter configured to generate an inverted clock of the ½-frequency selected clock, and a selector configured to select either one of the ½-frequency selected clock and the inverted clock of the ½-frequency selected clock based on the phase selection signal and output the selected one as the phase-adjusted clock, and the second phase control circuit includes a third ½ frequency divider configured to divide the selected clock by two to generate a second ½-frequency selected clock, a phase comparator configured to compare phases between the intermediate reference clock and the second ½-frequency selected clock, and a controller configured to control an inversion control signal for the second ½ frequency division circuit having the phase inversion function so that the ½-frequency selected clock is output if the phase comparison result from the phase comparator is in the phase relationship based on the phase selection signal, or otherwise the inverted clock of the ½-frequency selected clock is output, as the phase-adjusted clock.

In the phase adjustment circuit described above, preferably, the multiphase clock-generation circuit includes a frequency-doubling phase locked circuit including a phase comparator configured to compare phases between an input clock and a feedback clock, a charge pump circuit configured to store/release charge according to the phase comparison result from the phase comparator, a loop filter configured to smooth the charge in the charge pump circuit, a multiphase-output voltage-controlled oscillator configured to output multiphase clocks having a frequency corresponding to the voltage of the loop filter, and a ½ frequency divider configured to divide the frequency of one of the multiphase outputs of the multiphase-output voltage-controlled oscillator by two and output the result to the phase comparator as the feedback clock, and the input clock of the phase locked circuit is used as the reference clock.

In the phase adjustment circuit described above, preferably, the multiphase clock-generation circuit includes a frequency-doubling phase locked circuit including a phase comparator configured to compare phases between an input clock and a feedback clock, a charge pump circuit configured to store/release charge according to the phase comparison result from the phase comparator, a loop filter configured to smooth the charge in the charge pump circuit, a multiphase-output voltage-controlled oscillator configured to output multiphase clocks having a frequency corresponding to the voltage of the loop filter, and a ½ frequency divider configured to divide the frequency of one of the multiphase outputs of the multiphase-output voltage-controlled oscillator by two and output the result to the phase comparator as the feedback clock, and the feedback clock of the phase locked circuit is used as the reference clock.

As described above, according to the present disclosure, the first ½ frequency division circuit having the phase inversion function divides the phase of the intermediate clock apart in phase from both the phase reference clock and the selected clock by two, whereby the intermediate reference clock apart in phase from both the phase reference clock and the phase-adjusted clock can be generated. Also, the first phase control circuit controls the phase of the intermediate reference clock so that the phase reference clock and the intermediate reference clock are in a desired phase relationship, and then the second phase control circuit controls the phase of the phase-adjusted clock so that the intermediate reference clock and the phase-adjusted clock are in a desired phase relationship. In other words, the phase of the phase-adjusted clock with respect to the phase reference clock is controlled indirectly via the intermediate reference clock without direct comparison of phases between the phase reference clock and the phase-adjusted clock. Thus, even when the phase-adjusted clock is adjusted to be close in phase to the phase reference clock, the determination on the phase relationship in the first and second phase control circuits is performed between clocks apart in phase from each other. It is therefore possible to implement a phase adjustment circuit that operates stably with its phase determination circuits kept from becoming unstable even when the phase resolution is enhanced.

Also, according to the present disclosure, the first and second ½ frequency division circuits having the phase inversion function and the first and second phase control circuits can be configured using simple circuits.

Moreover, according to the present disclosure, the clock delays in the first and second ½ frequency division circuits having the phase inversion function remain unchanged even when the output phases are subjected to inversion control. This provides the advantage that the phase position of the phase-adjusted clock does not vary.

In addition, according to the present disclosure, the phase comparator of the second phase control circuit uses the second ½-frequency selected clock in place of the ½-frequency selected clock. Therefore, even when the second ½ frequency division circuit having the phase inversion function is placed near a block that requires a 50% duty-cycle clock for preventing or reducing degradation in duty cycle, no influence is exerted on the phase difference between the clocks the phases of which are compared by the phase comparator of the second phase control circuit. Thus, the second phase control circuit can be operated stably.

According to the present disclosure, a clock synchronized in phase with the phase reference clock with a frequency twice as high as that of the phase reference clock can be obtained easily.

Furthermore, according to the present disclosure, it is possible to preclude the influence of variations in stationary phase error caused by the phase comparator, the charge pump circuit, etc. constituting the phase locked circuit, and thus prevent or reduce variations in the phase relationship between the phase reference clock and the intermediate reference clock in the first phase control circuit. Therefore, a phase adjustment circuit operating further stably can be implemented.

As described above, according to the phase adjustment circuit of the present disclosure, even when the phase-adjusted clock is adjusted to be close in phase to the phase reference clock, the phase of the phase-adjusted clock with respect to the phase reference clock is controlled indirectly via the intermediate reference clock without direct comparison of phases between the phase reference clock and the phase-adjusted clock. Therefore, it is possible to implement a phase adjustment circuit that can perform phase determination stably even when the phase resolution is enhanced.

DETAILED DESCRIPTION

Embodiments of the present disclosure will be described hereinafter with reference to the accompanying drawings.

First Embodiment

Figure 1:
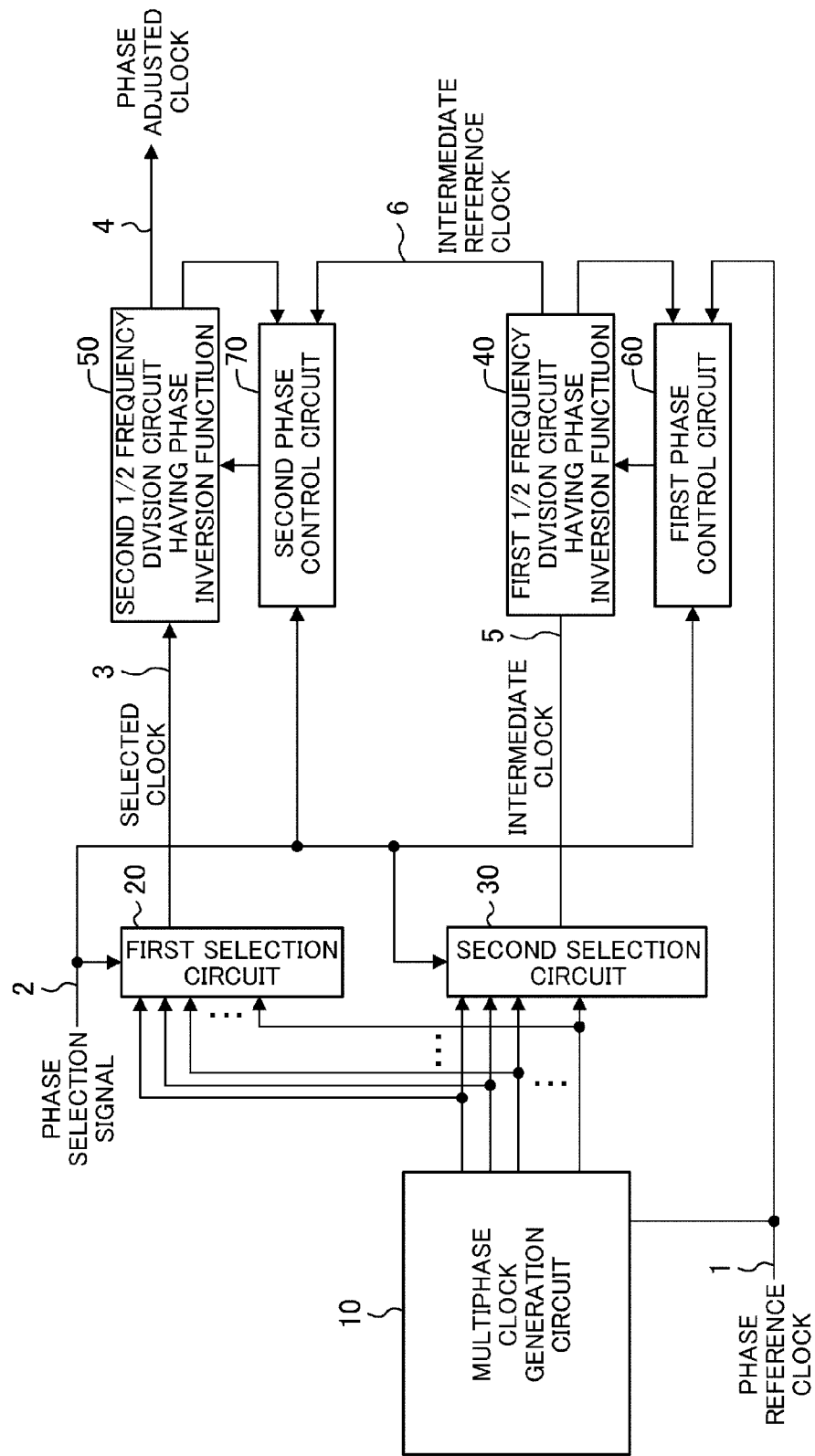
FIG. 1 is a block diagram of a phase adjustment circuit of the first embodiment of the present disclosure.

In FIG. 1, a phase adjustment circuit of the first embodiment includes: a multiphase clock-generation circuit 10 that generates multiphase clocks having a frequency twice as high as the frequency of a phase reference clock 1; a first selection circuit 20 that selects one of the multiphase clocks based on a phase selection signal 2 and outputs the result as a selected clock 3; a second selection circuit 30 that selects a clock, among the multiphase clocks, that is apart in phase from both the phase reference clock 1 and the selected clock 3 and outputs the result as an intermediate clock 5; a first ½ frequency division circuit 40 having a phase inversion function that divides the frequency of the intermediate clock 5 by two and outputs the result as an intermediate reference clock 6; a second ½ frequency division circuit 50 having a phase inversion function that divides the frequency of the selected clock 3 by two and outputs the result as a phase-adjusted clock 4; a first phase control circuit 60 that controls the output phase of the first ½ frequency division circuit 40 having the phase inversion function that generates the intermediate reference clock 6 so that the phase reference clock 1 and the intermediate reference clock 6 are in a phase relationship based on the phase selection signal 2; and a second phase control circuit 70 that controls the output phase of the second ½ frequency division circuit 50 having the phase inversion function that generates the phase-adjusted clock 4 so that the intermediate reference clock 6 and the phase-adjusted clock 4 are in a phase relationship based on the phase selection signal 2.

Figure 2:
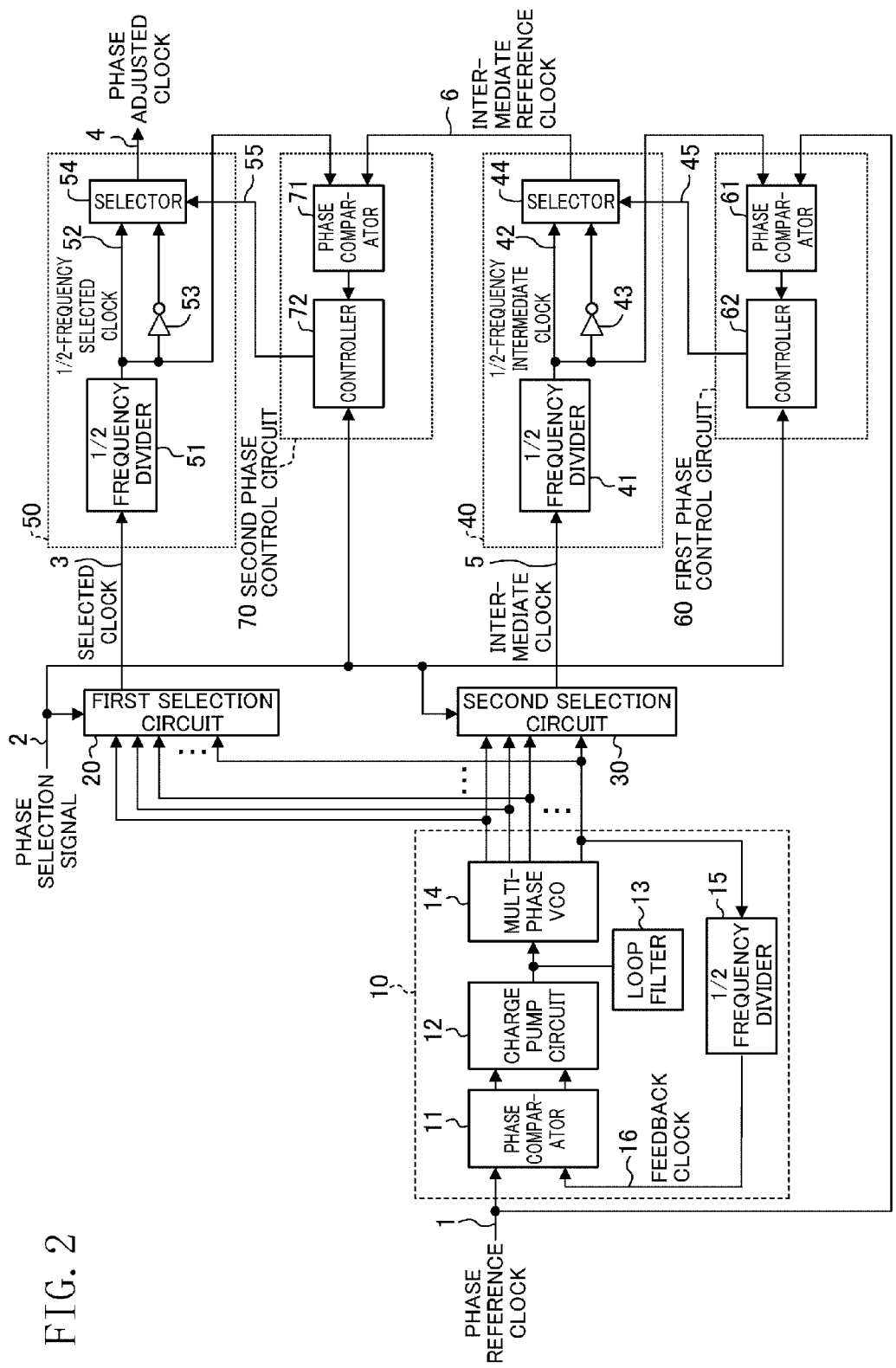
FIG. 2 is a diagram showing a specific circuit configuration of the phase adjustment circuit of the first embodiment.

FIG. 2 shows specific circuit configurations of the first and second ½ frequency division circuits 40 and 50 having the phase inversion function and the first and second phase control circuits 60 and 70 constituting the phase adjustment circuit of the first embodiment.

In FIG. 2, the first ½ frequency division circuit 40 having the phase inversion function includes: a first ½ frequency divider 41 that divides the frequency of the intermediate clock 5 by two to generate a ½-frequency intermediate clock 42; an inverter 43 that generates an inverted clock of the ½-frequency intermediate clock 42; and a selector 44 that selects either one of the ½-frequency intermediate clock 42 and the inverted clock of the ½-frequency intermediate clock 42 based on an inversion control signal 45 and outputs the result as the intermediate reference clock 6.

Likewise, the second ½ frequency division circuit 50 having the phase inversion function includes: a second ½ frequency divider 51 that divides the frequency of the selected clock 3 by two to generate a ½-frequency selected clock 52; an inverter 53 that generates an inverted clock of the ½-frequency selected clock 52; and a selector 54 that selects either one of the ½-frequency selected clock 52 and the inverted clock of the ½-frequency selected clock 52 based on an inversion control signal 55 and outputs the result as the phase-adjusted clock 4.

The first phase control circuit 60 includes: a phase comparator 61 that compares phases between the phase reference clock 1 and the ½-frequency intermediate clock 42; and a controller 62 that controls the inversion control signal 45 for the first ½ frequency division circuit 40 having the phase inversion function so that the ½-frequency intermediate clock 42 is output if the phase comparison result from the phase comparator 61 is in the phase relationship based on the phase selection signal 2, or otherwise the inverted clock of the ½-frequency intermediate clock 42 is output, as the intermediate reference clock 6.

Likewise, the second phase control circuit 70 includes: a phase comparator 71 that compares phases between the intermediate reference clock 6 and the ½-frequency selected clock 52; and a controller 72 that controls the inversion control signal 55 for the second ½ frequency division circuit 50 having the phase inversion function so that the ½-frequency selected clock 52 is output if the phase comparison result from the phase comparator 71 is in the phase relationship based on the phase selection signal 2, or otherwise the inverted clock of the ½-frequency selected clock 52 is output, as the phase-adjusted clock 4.

Also, in FIG. 2, the multiphase clock-generation circuit 10 is comprised of a frequency-doubling phase locked circuit including: a phase comparator 11 that compares phases between an input clock and a feedback clock 16; a charge pump circuit 12 that stores/releases charge according to the phase comparison result from the phase comparator 11; a loop filter 13 that smoothes the charge in the charge pump circuit 12; a multiphase-output voltage-controlled oscillator 14 that outputs multiphase clocks having a frequency corresponding to the voltage of the loop filter 13; and a ½ frequency divider 15 that divides the frequency of one of the multiphase outputs of the multiphase-output voltage-controlled oscillator 14 by two and outputs the result to the phase comparator 11 as the feedback clock 16. The input clock of the phase locked circuit is used as the phase reference clock 1.

The operation of the phase adjustment circuit having the above configuration will be described.

Assume that the phase locked circuit constituting the multiphase clock-generation circuit 10 outputs eight-phase clocks.

First, the phase locked circuit having eight-phase clock outputs generates eight-phase clocks having a frequency twice as high as the phase reference clock 1. Note that, in the item "eight-phase clocks" in FIGS. 6-9, the eight-phase clocks output from the phase locked circuit are schematically illustrated with T representing the rising edges of the clocks, where the eight-phase clocks are generated at equal phase intervals of one-eighth of a half cycle of the phase reference clock 1. Note also that, when the phase 0 clock, out of the eight-phase clocks from the phase locked circuit, is used as the feedback clock 16, the clocks are generated so that the rising edge of the phase 0 clock approximately matches with the phase of the phase reference clock 1 as shown in FIGS. 6-9.

Then, the first selection circuit 20 selects the selected clock 3, and the second selection circuit 30 selects the intermediate clock 5. How to select these clocks will be described hereinafter.

Figure 6:
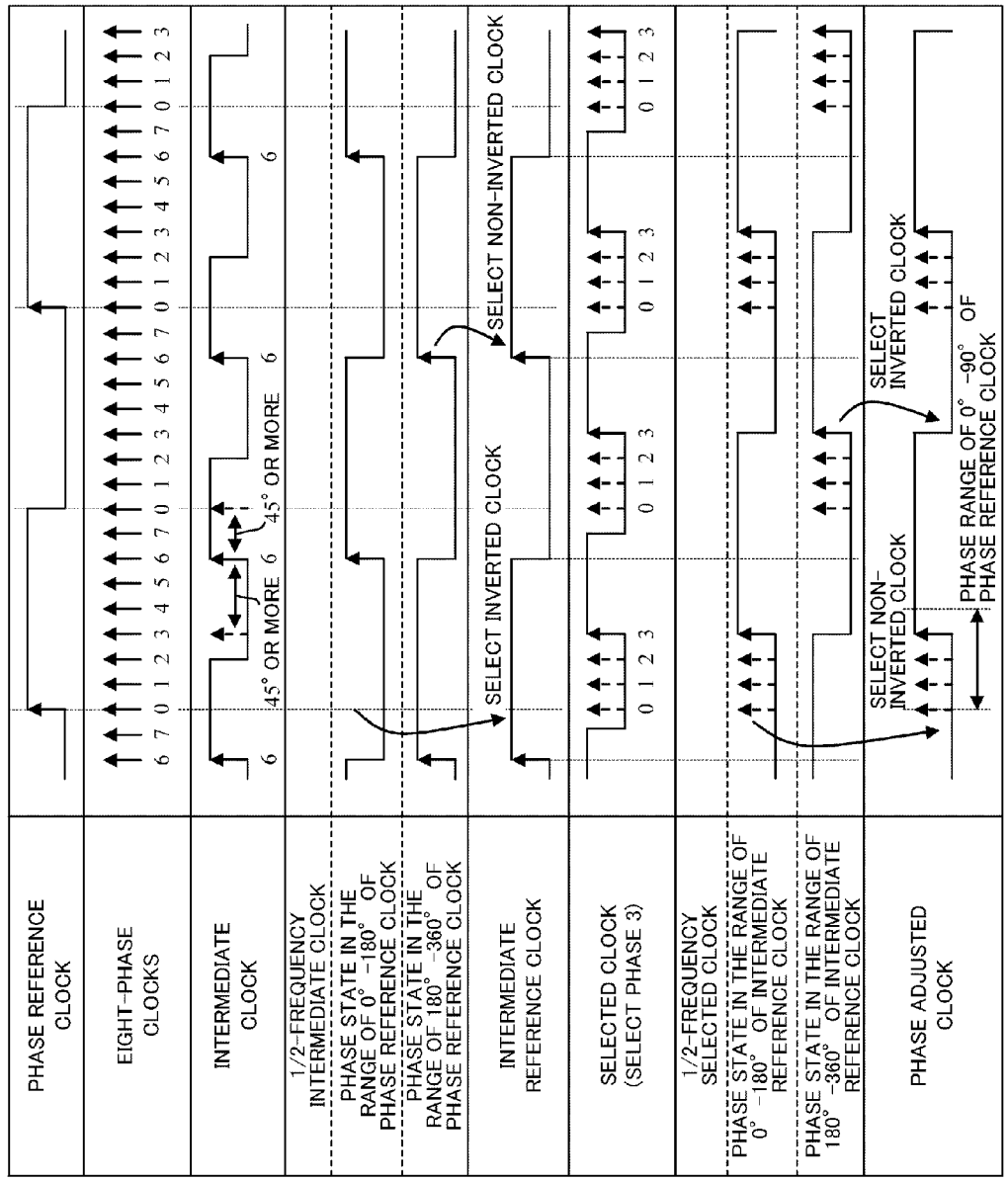
FIG. 6 is a chart showing clock-waveforms observed when a phase-adjusted clock is adjusted to be in the range of 0°-90° of a phase reference clock in the phase adjustment circuit of the first embodiment.
Figure 7:
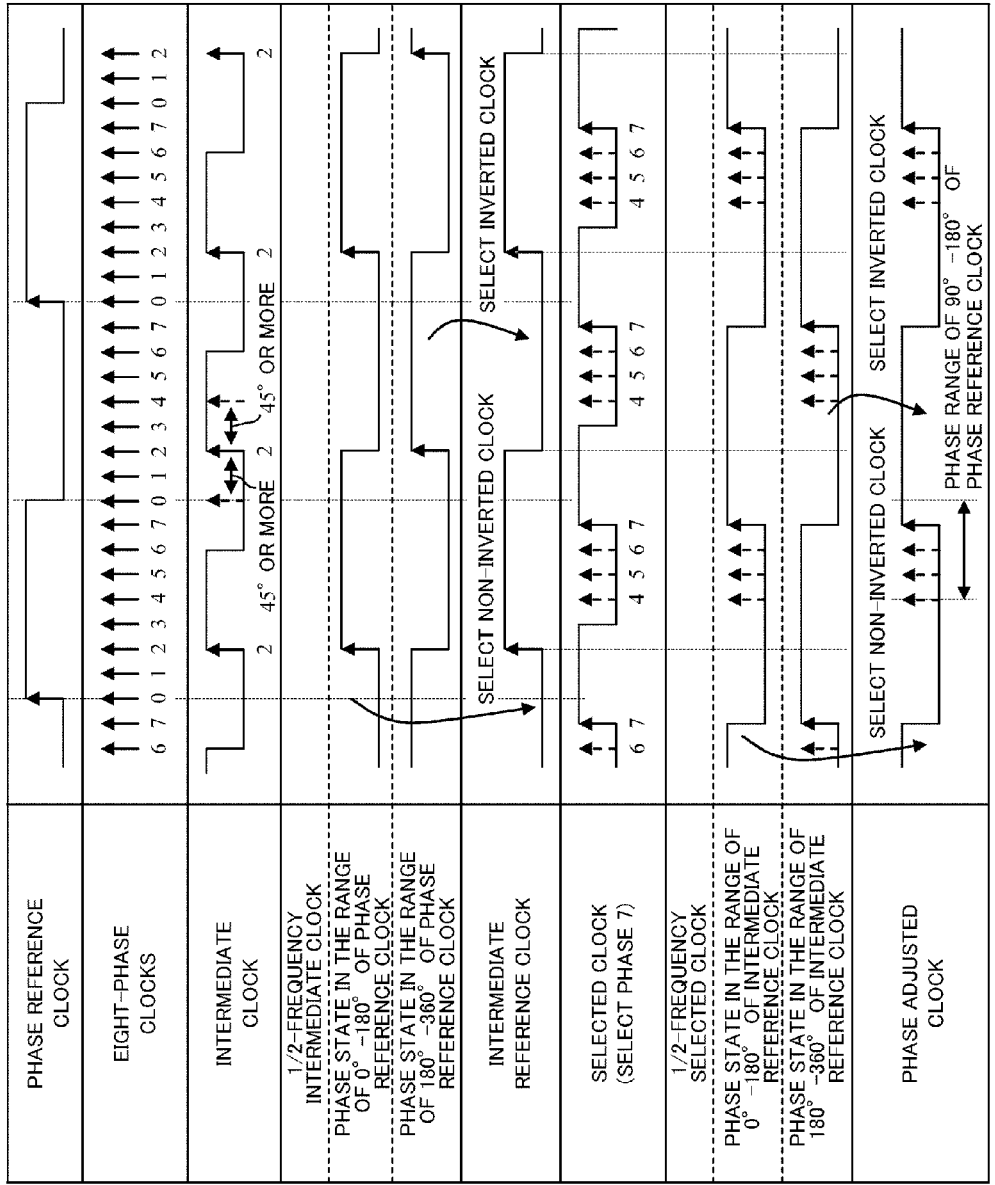
FIG. 7 is a chart showing clock-waveforms observed when the phase-adjusted clock is adjusted to be in the range of 90°-180° of the phase reference clock in the phase adjustment circuit of the first embodiment.
Figure 8:
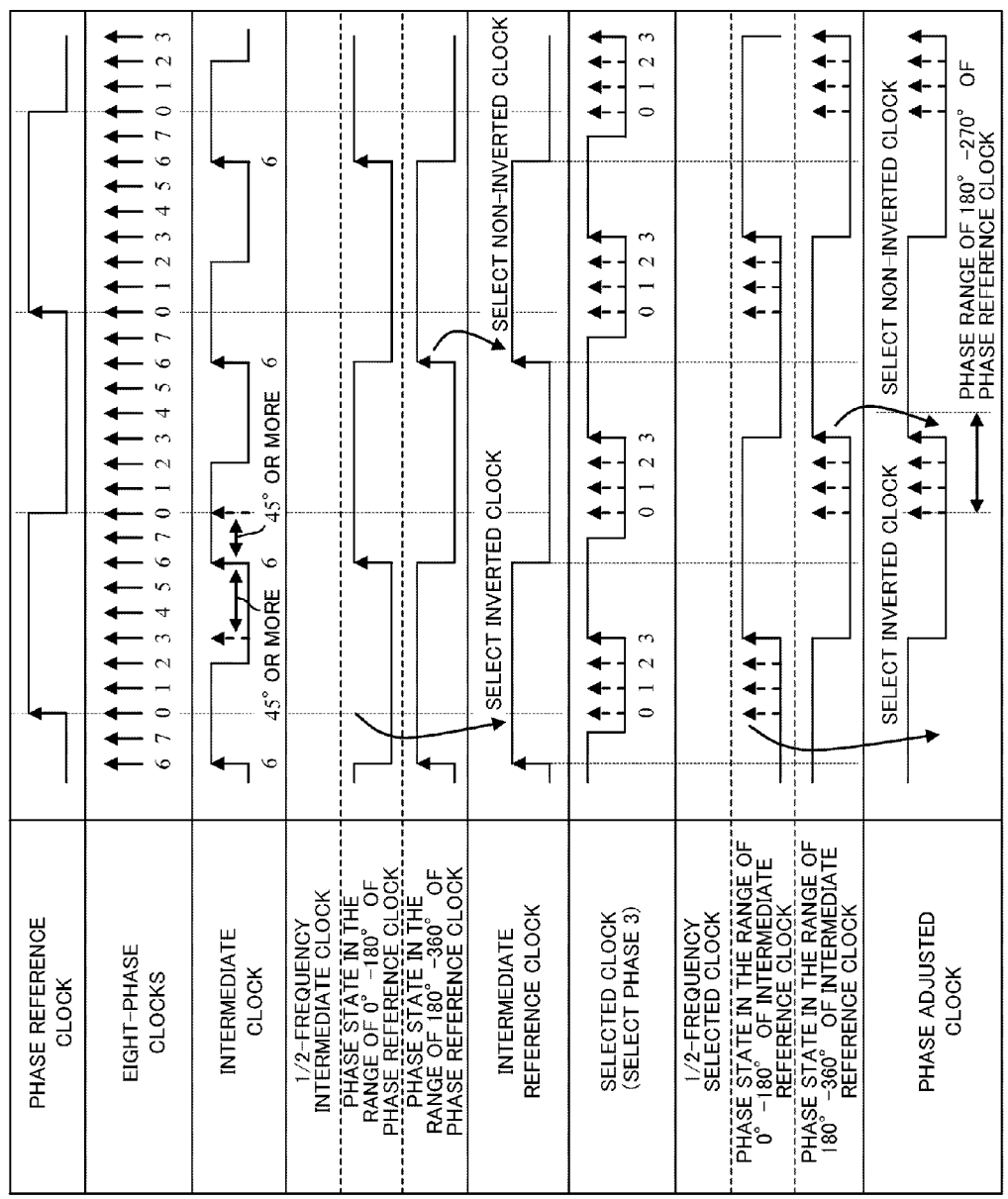
FIG. 8 is a chart showing clock-waveforms observed when the phase-adjusted clock is adjusted to be in the range of 180°-270° of the phase reference clock in the phase adjustment circuit of the first embodiment.
Figure 9:
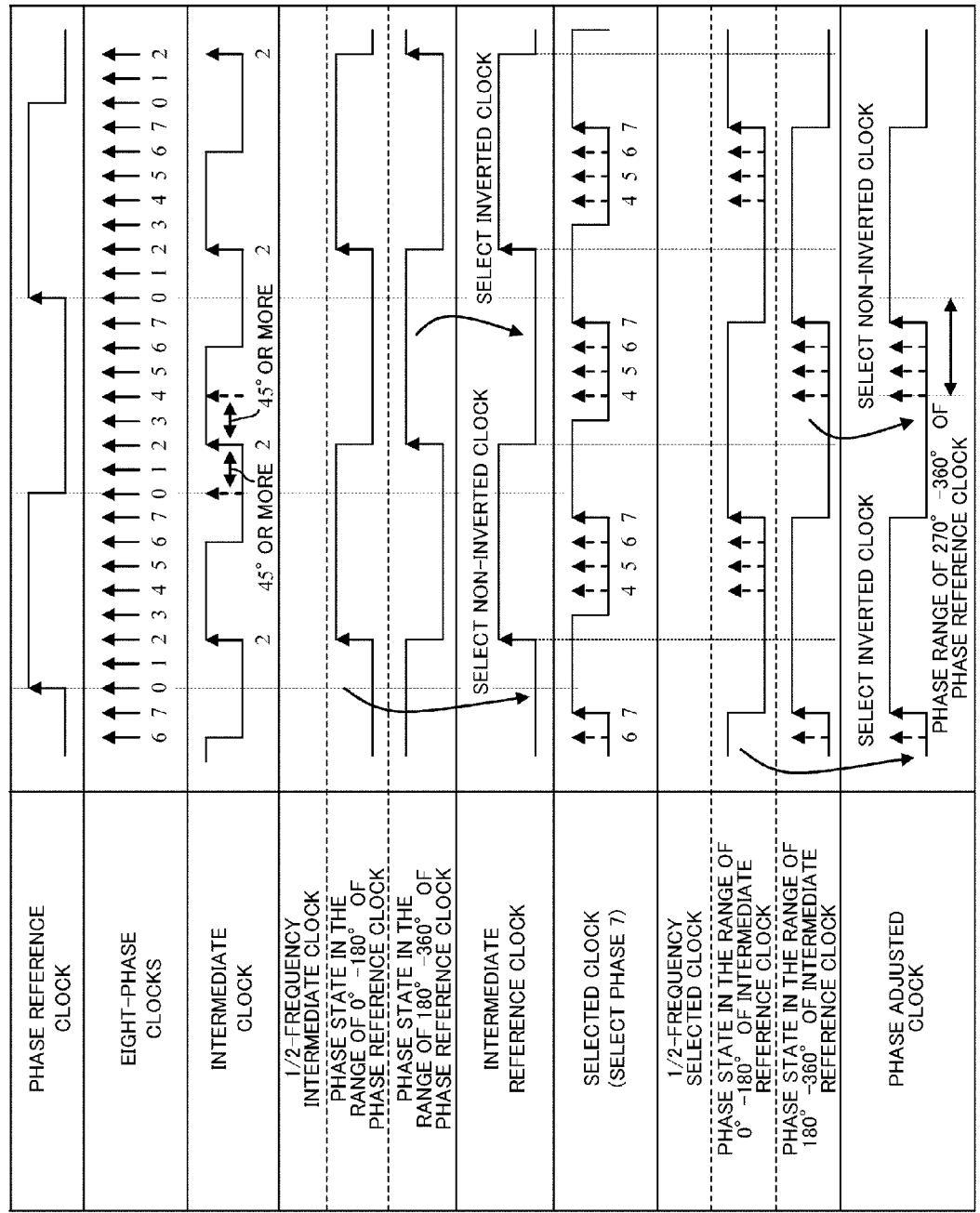
FIG. 9 is a chart showing clock-waveforms observed when the phase-adjusted clock is adjusted to be in the range of 270°-360° of the phase reference clock in the phase adjustment circuit of the first embodiment.
Figure 10:
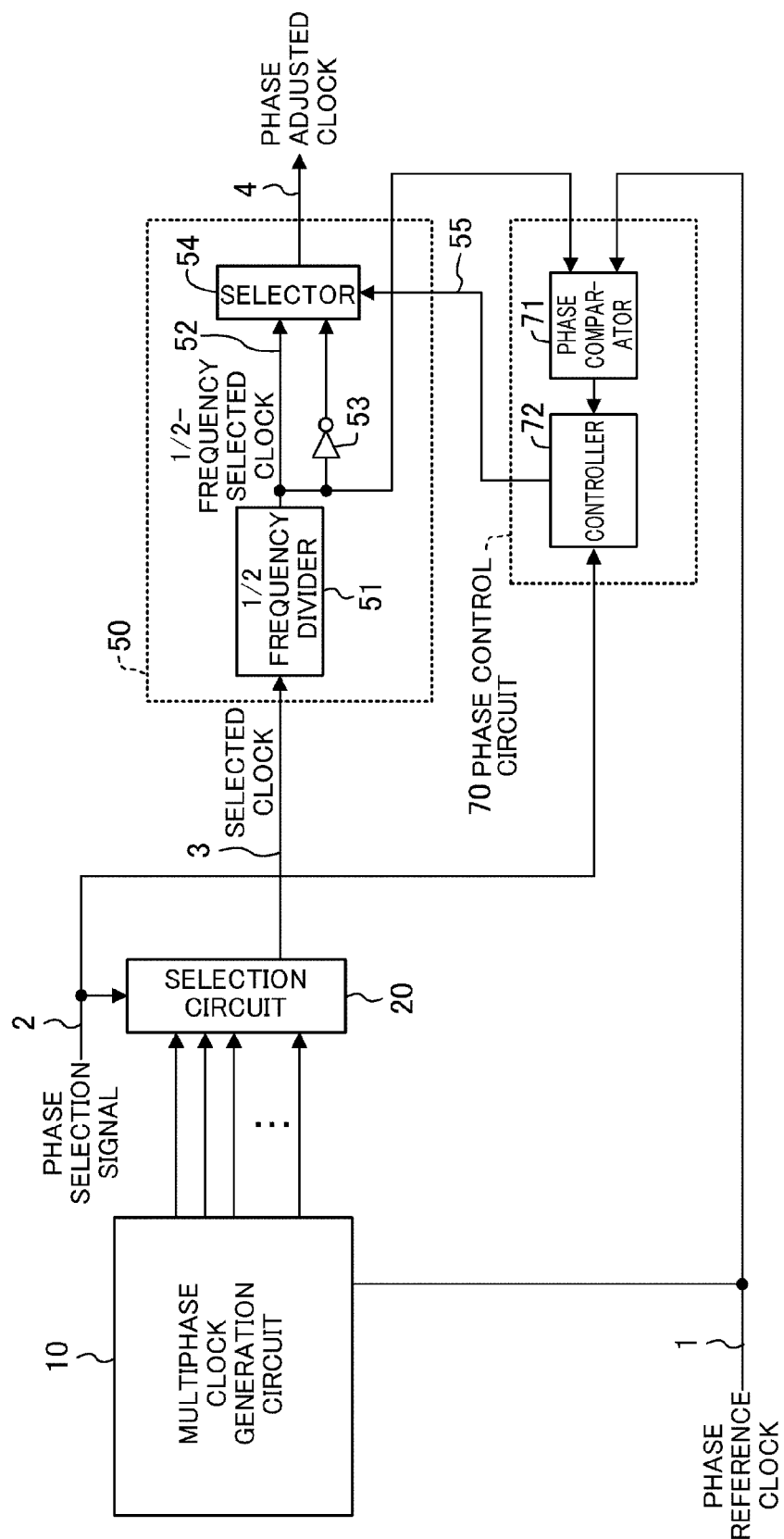
FIG. 10 is a diagram showing a configuration of a conventional phase adjustment circuit.
Figure 11A:
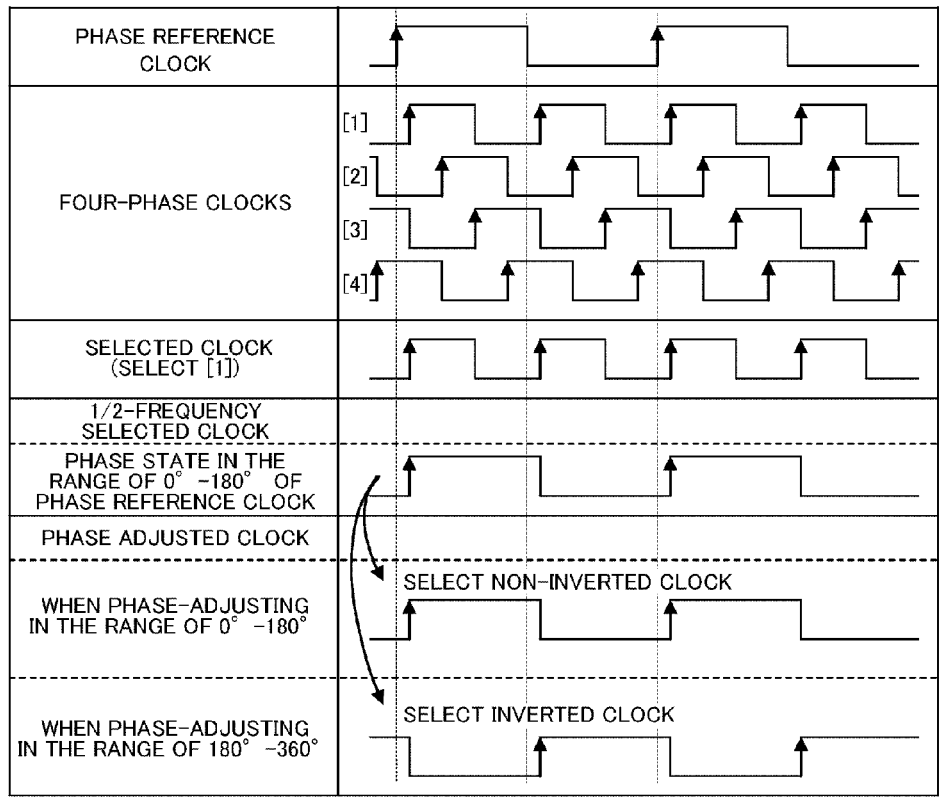
FIG. 11A shows clock waveforms observed when the phase of the ½-frequency selected clock is in the range of 0°-180° of the phase reference clock.
Figure 11B:
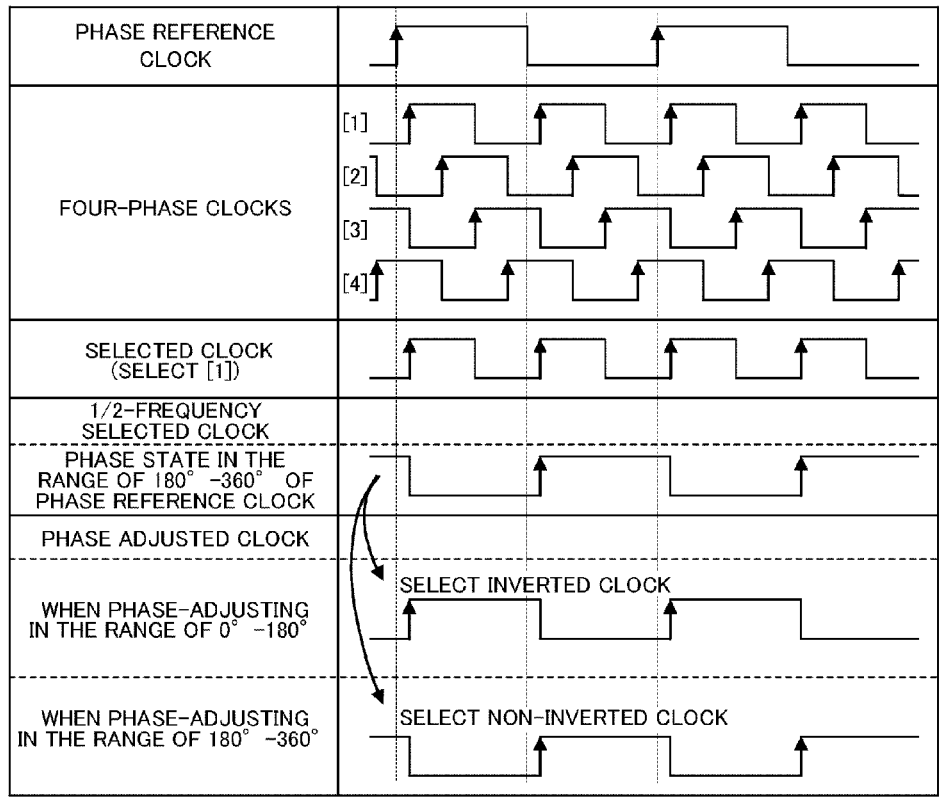
FIG. 11B shows clock waveforms observed when the phase of the ½-frequency selected clock is in the range of 180°-360° of the phase reference clock, in the conventional phase adjustment circuit.

FIGS. 6-9 show how the selected clock 3 and the intermediate clock 5 are selected from the eight-phase clocks in the respective cases of adjusting the phase of the phase-adjusted clock 4 to be in the ranges of 0°-90°, 90°-180°, 180°-270°, and 270-360° with respect to the phase reference clock 1. In the first embodiment, when the phase of the phase-adjusted clock 4 is adjusted to be in the ranges of 0°-90° and 180°-270° as shown in FIGS. 6 and 8, any of the phase 0 to phase 3 clocks is selected as the selected clock 3 and the phase 6 clock is selected as the intermediate clock 5. Likewise, when the phase of the phase-adjusted clock 4 is adjusted to be in the ranges of 90°-180° and 270°-360° as shown in FIGS. 7 and 9, any of the phase 4 to phase 7 clocks is selected as the selected clock 3 and the phase 2 clock is selected as the intermediate clock 5. By this selection, a clock apart in phase from both the phase reference clock 1 and the selected clock 3 by 45° or more is selected as the intermediate clock 5 in all of FIGS. 6-9.

Next, the phase control of the intermediate reference clock 6 will be described.

First, the ½-frequency intermediate clock 42 is generated by dividing the frequency of the intermediate clock 5 by two by the first ½ frequency divider 41. Whether the phase of the ½-frequency intermediate clock 42 is in the range of 0°-180° or in the range of 180°-360° with respect to the phase reference clock 1 is uncertain because it depends on the initial state of the first ½ frequency divider 41 and the input timing of the intermediate clock 5. Therefore, the phase comparator 61 of the first phase control circuit 60 compares phases between the phase reference clock 1 and the ½-frequency intermediate clock 42 to determine in which range, 0°-180° or 180°-360°, the phase of the ½-frequency intermediate clock 42 is. Then, the controller 62 controls the inversion control signal 45 for the first ½ frequency division circuit 40 having the phase inversion function so that the ½-frequency intermediate clock 42 is output when the phase comparison result from the phase comparator 61 is in the phase relationship based on the phase selection signal 2, or otherwise the inverted clock of the ½-frequency intermediate clock 42 is output, as the intermediate reference clock 6. By this control, irrespective of the initial state of the first ½ frequency divider 41 of the ½ frequency division circuit 40 having the first phase inversion circuit, the phase of the intermediate reference clock 6 is controlled to be based on the phase selection signal 2 with respect to the phase reference clock 1.

In the first embodiment, in the case of adjusting the phase of the phase-adjusted clock 4 to be in the ranges of 0°-90° and 180°-270° of the phase reference clock 1 as shown in FIGS. 6 and 8, the phase of the intermediate reference clock 6 with respect to the phase reference clock 1 is controlled to be in the range of 180°-360°. Likewise, in the case of adjusting the phase of the phase-adjusted clock 4 to be in the ranges of 90°-180° and 270°-360° of the phase reference clock 1 as shown in FIGS. 7 and 9, the phase of the intermediate reference clock 6 with respect to the phase reference clock 1 is controlled to be in the range of 0°-180°.

Although the phase range of the intermediate reference clock 6 with respect to the phase reference clock 1 after the phase control is determined based on the phase adjustment range (based on the phase selection signal 2) in this embodiment, the phase range may be fixed invariably irrespective of the phase adjustment range (the phase selection signal 2). In this case, however, it is necessary to change the phase control of the phase-adjusted clock that is to be described hereinafter.

Next, the phase control of the phase-adjusted clock 4 will be described.

First, the ½-frequency selected clock 52 is generated by dividing the frequency of the selected clock 3 by two by the second ½ frequency divider 51. Whether the phase of the ½-frequency selected clock 52 is in the range of 0°-180° or in the range of 180°-360° with respect to the phase reference clock 1 is uncertain because it depends on the initial state of the second ½ frequency divider 51 and the input timing of the selected clock 3. Therefore, the phase comparator 71 of the second phase control circuit 70 compares phases between the intermediate reference clock 6 and the ½-frequency selected clock 52 to determine in which range, 0°-180° or 180°-360°, the phase of the ½-frequency selected clock 52 is. Then, the controller 72 controls the inversion control signal 55 for the second ½ frequency division circuit 50 having the phase inversion function so that the ½-frequency selected clock 52 is output when the phase comparison result from the phase comparator 71 is in the phase relationship based on the phase selection signal 2, or otherwise the inverted clock of the ½-frequency selected clock 52 is output, as the phase-adjusted clock 4.

By the above control, irrespective of the initial state of the second ½ frequency divider 51 of the ½ frequency division circuit 50 having the second phase inversion circuit, the phase of the phase-adjusted clock 4 is controlled to be based on the phase selection signal 2 with respect to the intermediate reference clock 6. As described earlier, the phase of the intermediate reference clock 6 has been controlled with respect to the phase reference clock 1. Therefore, the phase-adjusted clock 4 controlled based on the phase selection signal 2 using the intermediate reference clock 6 as the reference is a clock phase-adjusted with respect to the phase reference clock 1.

In the first embodiment, in the case of adjusting the phase of the phase-adjusted clock 4 to be in the ranges of 0°-90° and 90°-180° of the phase reference clock 1 as shown in FIGS. 6 and 7, the phase of the phase-adjusted clock 4 with respect to the intermediate reference clock 6 is controlled to be in the range of 0°-180°. By this phase control, it is found that the phase of the phase-adjusted clock 4 is adjusted to be in the range of 0°-90° with respect to the phase reference clock 1 in FIG. 6, and in the range of 90°-180° with respect to the phase reference clock 1 in FIG. 7. Likewise, in the case of adjusting the phase of the phase-adjusted clock 4 to be in the ranges of 180°-270° and 270°-360° of the phase reference clock 1 as shown in FIGS. 8 and 9, the phase of the phase-adjusted clock 4 with respect to the intermediate reference clock 6 is controlled to be in the range of 180°-360°. By this phase control, it is found that the phase of the phase-adjusted clock 4 is adjusted to be in the range of 180°-270° with respect to the phase reference clock 1 in FIG. 8, and in the range of 270°-360° with respect to the phase reference clock 1 in FIG. 9.

As described above, by dividing the frequency of the intermediate clock 5 that is apart in phase from both the phase reference clock 1 and the selected clock 3, the intermediate reference clock 6 apart in phase from both the phase reference clock 1 and the phase-adjusted clock 4 can be generated. Also, by controlling the phase of the intermediate reference clock 6 by the first phase control circuit 60 so that the phase reference clock 1 and the intermediate reference clock 6 are in the phase relationship based on the phase selection signal 2, and then by controlling the phase of the phase-adjusted clock 4 by the second phase control circuit 70 so that the intermediate reference clock 6 and the phase-adjusted clock 4 are in the phase relationship based on the phase selection signal 2, the phase of the phase-adjusted clock 4 with respect to the phase reference clock 1 can be controlled indirectly via the intermediate reference clock 6 without direct comparison between the phase reference clock 1 and the phase-adjusted clock 4.

Accordingly, in this embodiment, even when the phase-adjusted clock 4 is adjusted to be close in phase to the phase reference clock 1, the determination on the phase relationship by the phase comparators 61 and 71 of the first and second phase control circuits 60 and 70 is performed between clocks apart in phase from each other. Also, the minimum phase difference between the phase reference clock 1 and the intermediate reference clock 6 and the minimum phase difference between the phase-adjusted clock 4 and the intermediate reference clock 6 remain unchanged even when the phase resolution is enhanced if only these clocks have the same frequency. Therefore, the phase adjustment circuit having the phase comparators 61 and 71 operating stably can be implemented.

Second Embodiment

A phase adjustment circuit of the second embodiment of the present disclosure will be described hereinafter with reference to the relevant drawings. Note that, in this embodiment, components similar to those in the first embodiment are denoted by the same reference characters and detailed description of such components is omitted here.

Figure 3:
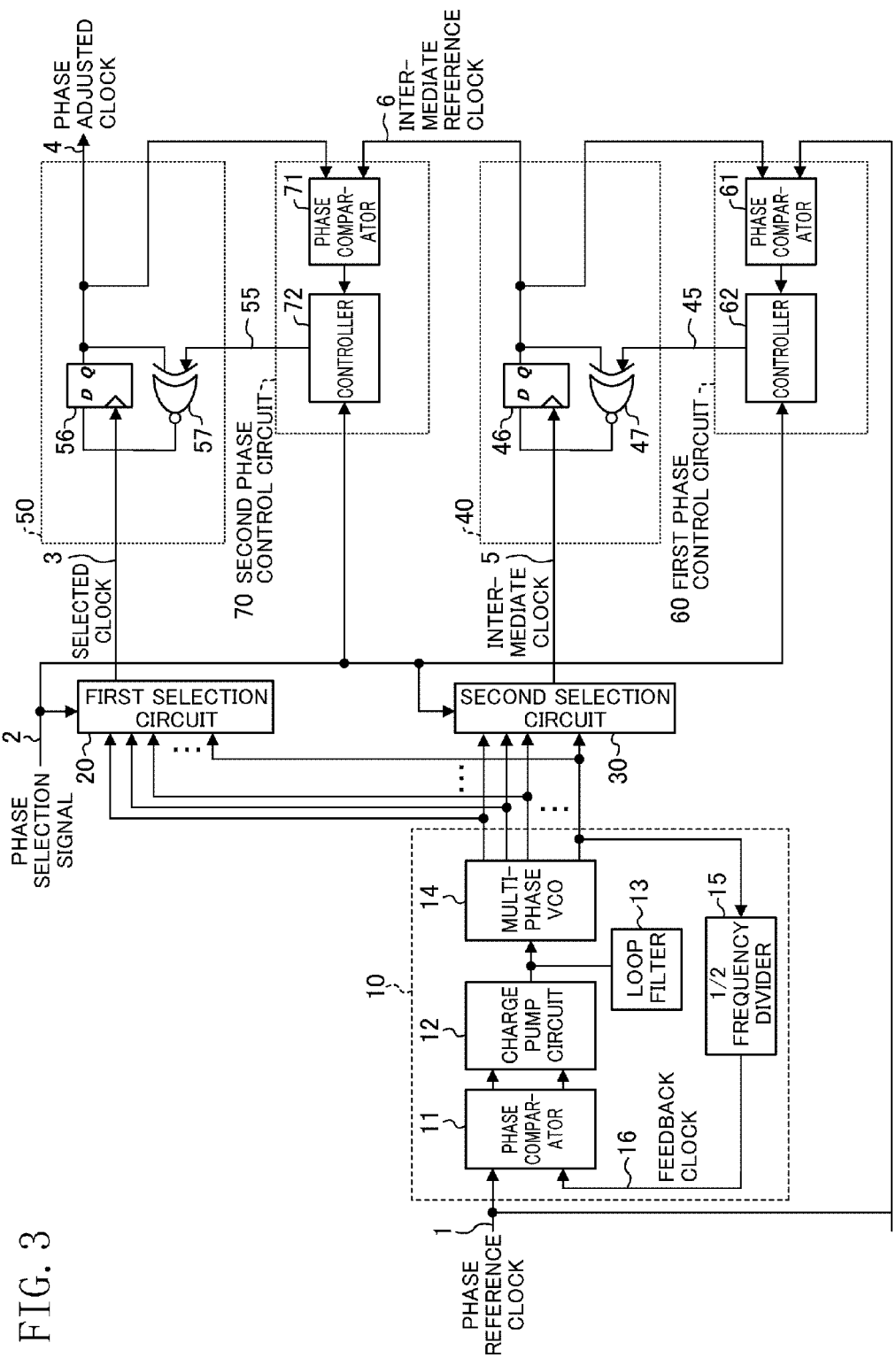
FIG. 3 is a diagram showing a specific circuit configuration of a phase adjustment circuit of the second embodiment of the present disclosure.

FIG. 3 shows a circuit configuration of the phase adjustment circuit of the second embodiment. This embodiment is different from the first embodiment in the configurations of the first and second ½ frequency division circuits having the phase inversion function and the first and second phase control circuits.

In FIG. 3, the first ½ frequency division circuit 40 having the phase inversion function includes: a D-type flipflop 46 that receives the intermediate clock 5 as its clock signal and supplies its output as the intermediate reference clock 6; and an EX-NOR circuit 47 that receives the output of the D-type flipflop 46 and the inversion control signal 45 as its inputs and supplies its output to the data input of the D-type flipflop 46.

Likewise, the second ½ frequency division circuit 50 having the phase inversion function includes: a D-type flipflop 56 that receives the selected clock 3 as its clock signal and supplies its output as the phase-adjusted clock 4; and an EX-NOR circuit 57 that receives the output of the D-type flipflop 56 and the inversion control signal 55 as its inputs and supplies its output to the data input of the D-type flipflop 56.

The first phase control circuit 60 includes: a phase comparator 61 that compares phases between the phase reference clock 1 and the intermediate reference clock 6; and a controller 62 that performs phase inversion control for the intermediate reference clock 6, by supplying a signal having a pulse width equal to the period of the intermediate clock 5 as the inversion control signal 45 to the first ½ frequency division circuit 40 having the phase inversion function, only when the phase comparison result from the phase comparator 61 is not in the phase relationship based on the phase selection signal.

Likewise, the second phase control circuit 70 includes: a phase comparator 71 that compares phases between the intermediate reference clock 6 and the phase-adjusted clock 4; and a controller 72 that performs phase inversion control for the phase-adjusted clock 4, by supplying a signal having a pulse width equal to the period of the selected clock 4 as the inversion control signal 55 to the second ½ frequency division circuit 50 having the phase inversion function, only when the phase comparison result from the phase comparator 71 is not in the phase relationship based on the phase selection signal 2.

The first and second ½ frequency division circuits 40 and 50 having the phase inversion function and the first and second phase control circuits 60 and 70 configured as described above will be described hereinafter.

In the case where the inversion control signal 45 is not input ("0" is input) into the EX-NOR circuit 47 of the first ½ frequency division circuit 40 having the phase inversion function, the EX-NOR circuit 47 operates as an inverter. Therefore, since the D-type flipflop 47 receives the inverted signal of its output at its data input, it operates as a ½ frequency divider. When it becomes necessary to invert the phase of the intermediate reference clock 6 that is the output clock of the first ½ frequency division circuit 40 having the phase inversion function, a signal having a pulse width equal to the period of the intermediate clock 5 is supplied as the inversion control signal 45 to the EX-NOR circuit 47 from the controller 62 of the first phase control circuit 60. In this case, the EX-NOR circuit 47 operates as a non-inverter for the time of one period of the intermediate clock 5. Thus, the circuit constituted by the D-type flipflop 46 and the EX-NOR circuit 47 keeps the same state for the time of one period of the intermediate clock 5, and thereafter operates again as the ½ frequency divider. By this operation, the output phase of the first ½ frequency division circuit 40 having the phase inversion function is subjected to inversion control.

The above control also applies to the second ½ frequency division circuit 50 having the phase inversion function.

With the configuration of the first and second ½ frequency division circuits having the phase inversion function as in this embodiment, the clock delays in the ½ frequency division circuits remain unchanged even when the output phases are subjected to inversion control. This provides the advantage that the phase position of the phase-adjusted clock does not vary.

Third Embodiment

A phase adjustment circuit of the third embodiment of the present disclosure will be described hereinafter with reference to the relevant drawings. Note that, in this embodiment, components similar to those in the first embodiment are denoted by the same reference characters and detailed description of such components is omitted here.

Figure 4:
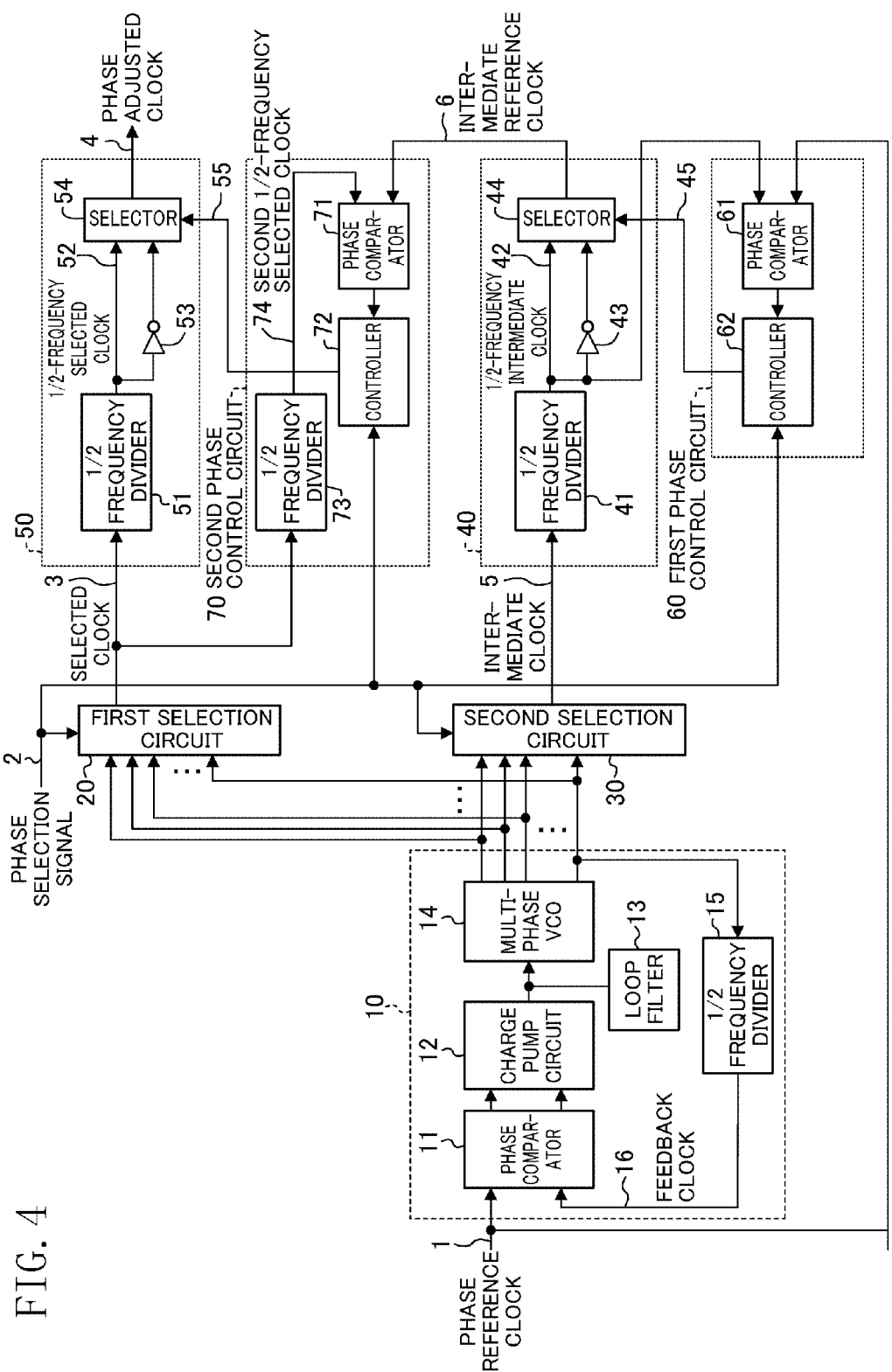
FIG. 4 is a diagram showing a specific circuit configuration of a phase adjustment circuit of the third embodiment of the present disclosure.

FIG. 4 shows a circuit configuration of the phase adjustment circuit of the third embodiment. This embodiment is different from the first embodiment in the configuration of the second phase control circuit 70.

In FIG. 4, the second phase control circuit 70 includes: a third ½ frequency divider 73 that divides the frequency of the selected clock 3 by two to output a second ½-frequency selected clock 74; a phase comparator 71 that compares phases between the intermediate reference clock 6 and the second ½-frequency selected clock 74; and a controller 72 that controls the inversion control signal 55 for the second ½ frequency division circuit 50 having the phase inversion function so that the ½-frequency selected clock 52 is output if the phase comparison result is in the phase relationship based on the phase selection signal 2, or otherwise the inverted clock of the ½-frequency selected clock 5 is output, as the phase-adjusted clock 4.

The operation of the phase adjustment circuit of the third embodiment having the configuration described above will be described.

In the second phase control circuit 70 in the first embodiment, the phase comparison is performed between the ½-frequency selected clock 52 from the second ½ frequency division circuit 50 having the phase inversion function and the intermediate reference clock 6, to control the output phase of the ½ frequency division circuit 50 based on the resultant phase relationship and the phase selection signal 2. In the third embodiment, the second ½-frequency selected clock 74 output from the third ½ frequency divider 73 provided in the second phase control circuit 70 is used, in place of the ½-frequency selected clock 52 from the second ½ frequency division circuit 50 having the phase inversion function, for the phase comparison with the intermediate reference clock 6, to control the output phase of the ½ frequency division circuit 50 based on the resultant phase relationship and the phase selection signal 2.

If only the second ½ frequency divider 51 and the third ½ frequency divider 73, which have the same input clock, i.e., the selected clock 3, start operating in the same initial state under reset control, the output clocks of the second and third ½ frequency dividers 51 and 73 are in the same phase state irrespective of the input timing of the clock into the ½ frequency dividers 51 and 73.

Therefore, phase adjustment of the phase-adjusted clock 4 can be performed, as in the first embodiment, using the second ½-frequency selected clock 74 in place of the ½-frequency selected clock 52.

In the case where a block to which the phase-adjusted clock 4 is supplied is placed in the distance, the duty cycle of the phase-adjusted clock 4 may be degraded due to the presence of a buffer circuit, etc. in a supply path of the phase-adjusted clock 4. Therefore, it is desirable to place the second ½ frequency division circuit 50 having the phase inversion function near a block that requires a 50% duty-cycle clock.

In the above case, however, in the first embodiment, the distance between the second ½ frequency division circuit 50 having the phase inversion function and the second phase control circuit 70 becomes long. This increases the length of the path through which the ½-frequency selected clock 52 is sent to the phase comparator 71, and thus a delay in the path may influence the phase relationship between the intermediate reference clock 6 and the ½-frequency selected clock 52. With this influence, if the phases of these clocks are close to each other, the phase relationship may be easily inverted due to jitter, etc. Therefore, the phase determination by the phase comparator 71 may become unstable, increasing the possibility that the phase adjustment circuit may fail to operate normally.

By contrast, in the configuration of the third embodiment, even when the second ½ frequency division circuit 50 having the phase inversion function is placed near a block that requires a 50% duty-cycle clock, it is unnecessary to change the placement of the phase comparator 71 because the third ½ frequency divider 73 is provided to generate the second ½-frequency selected clock 74 that replaces the ½-frequency selected clock 52. Also, there is no change in the phase difference between the intermediate reference clock 6 and the second ½-frequency selected clock 74 the phases of which are compared by the phase comparator 71.

Thus, with the configuration of the third embodiment, even when the second ½ frequency division circuit 50 having the phase inversion function is placed near a block that requires a 50% duty-cycle clock for preventing or reducing degradation in duty cycle, the second phase control circuit 70 can be operated stably.

Note that this embodiment is also applicable to the second embodiment.

Fourth Embodiment

A phase adjustment circuit of the fourth embodiment of the present disclosure will be described hereinafter with reference to the relevant drawings. Note that, in this embodiment, components similar to those in the first embodiment are denoted by the same reference characters and detailed description of such components is omitted here.

Figure 5:
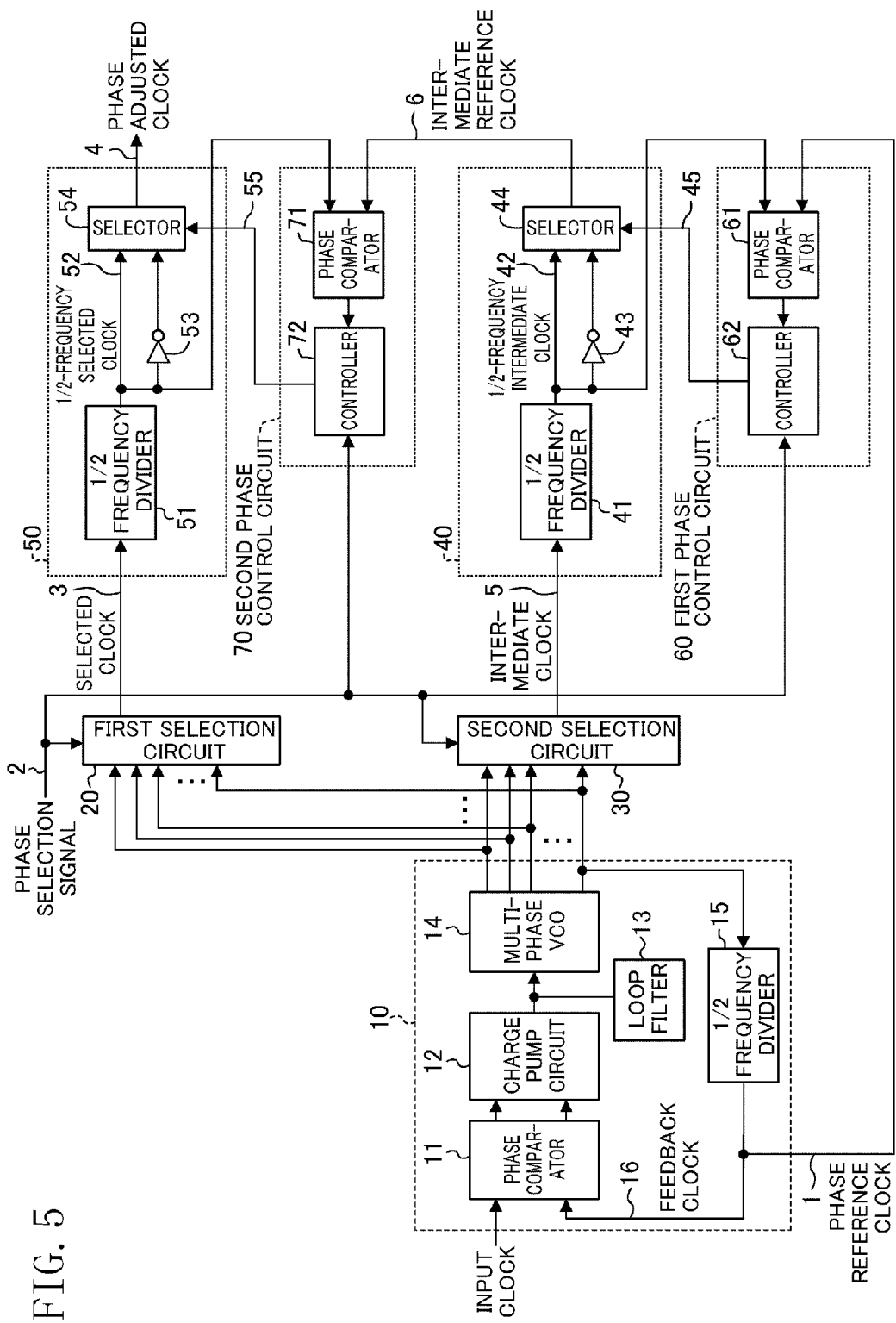
FIG. 5 is a diagram showing a specific circuit configuration of a phase adjustment circuit of the fourth embodiment of the present disclosure.

FIG. 5 shows a circuit configuration of the phase adjustment circuit of the fourth embodiment. In FIG. 5, as in the first embodiment, the multiphase clock-generation circuit 10 is comprised of a frequency-doubling phase locked circuit including: a phase comparator 11 that compares phases between an input clock and a feedback clock; a charge pump circuit 12 that stores/releases charge according to the phase comparison result from the phase comparator 11; a loop filter 13 that smoothes the charge in the charge pump circuit 12; a multiphase-output voltage-controlled oscillator 14 that outputs multiphase clocks having a frequency corresponding to the voltage of the loop filter 13; and a ½ frequency divider 15 that divides the frequency of one of the multiphase outputs of the multiphase-output voltage-controlled oscillator 14 by two and outputs the result to the phase comparator 11 as the feedback clock 16.

This embodiment is different from the first embodiment in that the feedback clock 16 is used as the phase reference clock 1.

By the above arrangement, it is possible to preclude variations in stationary phase error caused by the phase comparator 11, the charge pump circuit 12, etc., and therefore possible to prevent or reduce variations in the phase difference between the phase reference clock 1 and the intermediate reference clock 6 in the phase comparator 61 of the first phase control circuit 60. Thus, a phase adjustment circuit operating further more stable than in the first embodiment can be implemented.

Note that this embodiment is also applicable to the second and third embodiments.

As described above, the present disclosure is useful as a phase adjustment circuit that achieves high phase resolution when generating a clock having a frequency twice as high as a necessary clock frequency and dividing the frequency of the clock by two to generate a 50% duty-cycle phase-adjusted clock.

What is claimed is:

1. A phase adjustment circuit, comprising:
a multiphase clock-generation circuit configured to generate multiphase clocks having a frequency twice as high as the frequency of a reference clock;
a first selection circuit configured to select one of the multiphase clocks based on a phase selection signal and output the one as a selected clock;
a second selection circuit configured to select a clock, among the multiphase clocks, apart in phase from both the reference clock and the selected clock and output the clock as an intermediate clock;
a first ½ frequency division circuit having a phase inversion function configured to divide the frequency of the intermediate clock by two and output the resultant clock as an intermediate reference clock;
a second ½ frequency division circuit having a phase inversion function configured to divide the frequency of the selected clock and output the resultant clock as a phase-adjusted clock;
a first phase control circuit configured to control the output phase of the first ½ frequency division circuit having the phase inversion function that generates the intermediate reference clock so that the reference clock and the intermediate reference clock are in a phase relationship based on the phase selection signal; and
a second phase control circuit configured to control the output phase of the second ½ frequency division circuit having the phase inversion function that generates the phase-adjusted clock so that the intermediate reference clock and the phase-adjusted clock are in a phase relationship based on the phase selection signal.

2. The phase adjustment circuit of claim 1, wherein
the first ½ frequency division circuit having the phase inversion function includes
a first ½ frequency divider configured to divide the intermediate clock by two to generate a ½-frequency intermediate clock,
an inverter configured to generate an inverted clock of the ½-frequency intermediate clock, and
a selector configured to select either one of the ½-frequency intermediate clock and the inverted clock of the ½-frequency intermediate clock based on the phase selection signal and output the selected one as the intermediate reference clock,
the second ½ frequency division circuit having the phase inversion function includes
a second ½ frequency divider configured to divide the selected clock by two to generate a ½-frequency selected clock,
an inverter configured to generate an inverted clock of the ½-frequency selected clock, and
a selector configured to select either one of the ½-frequency selected clock and the inverted clock of the ½-frequency selected clock based on the phase selection signal and output the selected one as the phase-adjusted clock,
the first phase control circuit includes
a phase comparator configured to compare phases between the reference clock and the ½-frequency intermediate clock, and
a controller configured to control an inversion control signal for the first ½ frequency division circuit having the phase inversion function so that the ½-frequency intermediate clock is output if the phase comparison result from the phase comparator is in the phase relationship based on the phase selection signal, or otherwise the inverted clock of the ½-frequency intermediate clock is output, as the intermediate reference clock, and
the second phase control circuit includes
a phase comparator configured to compare phases between the intermediate reference clock and the ½-frequency selected clock, and
a controller configured to control an inversion control signal for the second ½ frequency division circuit having the phase inversion function so that the ½-frequency selected clock is output if the phase comparison result from the phase comparator is in the phase relationship based on the phase selection signal, or otherwise the inverted clock of the ½-frequency selected clock is output, as the phase-adjusted clock.

3. The phase adjustment circuit of claim 1, wherein
the first ½ frequency division circuit having the phase inversion function includes
a D-type flipflop configured to receive the intermediate clock as a clock signal and supply its output as the intermediate reference clock, and
an EX-NOR circuit configured to receive the output of the D-type flipflop and an inversion control signal as its inputs and have an output connected to a data input of the D-type flipflop,
the second ½ frequency division circuit having the phase inversion function includes
a D-type flipflop configured to receive the selected clock as a clock signal and supply its output as the phase-adjusted clock, and
an EX-NOR circuit configured to receive the output of the D-type flipflop and an inversion control signal as its inputs and have an output connected to a data input of the D-type flipflop,
the first phase control circuit includes a phase comparator configured to compare phases between the reference clock and the intermediate reference clock, and a controller configured to perform phase inversion control for the intermediate reference clock, by supplying a signal having a pulse width equal to the period of the intermediate clock as the inversion control signal to the ½ frequency division circuit having the first phase inversion function, only when the phase comparison result from the phase comparator is not in the phase relationship based on the phase selection signal, and the second phase control circuit includes a phase comparator configured to compare phases between the intermediate reference clock and the phase-adjusted clock, and a controller configured to perform phase inversion control for the phase-adjusted clock, by supplying a signal having a pulse width equal to the period of the selected clock as the inversion control signal to the ½ frequency division circuit having the second phase inversion function, only when the phase comparison result from the phase comparator is not in the phase relationship based on the phase selection signal.

4. The phase adjustment circuit of claim 1, wherein the second ½ frequency division circuit having the phase inversion function includes a second ½ frequency divider configured to divide the selected clock by two to generate a ½-frequency selected clock, an inverter configured to generate an inverted clock of the ½-frequency selected clock, and a selector configured to select either one of the ½-frequency selected clock and the inverted clock of the ½-frequency selected clock based on the phase selection signal and output the selected one as the phase-adjusted clock, and the second phase control circuit includes a third ½ frequency divider configured to divide the selected clock by two to generate a second ½-frequency selected clock, a phase comparator configured to compare phases between the intermediate reference clock and the second ½-frequency selected clock, and a controller configured to control an inversion control signal for the second ½ frequency division circuit having the phase inversion function so that the ½-frequency selected clock is output if the phase comparison result from the phase comparator is in the phase relationship based on the phase selection signal, or otherwise the inverted clock of the ½-frequency selected clock is output, as the phase-adjusted clock.

5. The phase adjustment circuit of claim 1, wherein the multiphase clock-generation circuit includes a frequency-doubling phase locked circuit including a phase comparator configured to compare phases between an input clock and a feedback clock, a charge pump circuit configured to store/release charge according to the phase comparison result from the phase comparator, a loop filter configured to smooth the charge in the charge pump circuit, a multiphase-output voltage-controlled oscillator configured to output multiphase clocks having a frequency corresponding to the voltage of the loop filter, and a ½ frequency divider configured to divide the frequency of one of the multiphase outputs of the multiphase-output voltage-controlled oscillator by two and output the result to the phase comparator as the feedback clock, and the input clock of the phase locked circuit is used as the reference clock.

6. The phase adjustment circuit of claim 1, wherein the multiphase clock-generation circuit includes a frequency-doubling phase locked circuit including a phase comparator configured to compare phases between an input clock and a feedback clock, a charge pump circuit configured to store/release charge according to the phase comparison result from the phase comparator, a loop filter configured to smooth the charge in the charge pump circuit, a multiphase-output voltage-controlled oscillator configured to output multiphase clocks having a frequency corresponding to the voltage of the loop filter, and a ½ frequency divider configured to divide the frequency of one of the multiphase outputs of the multiphase-output voltage-controlled oscillator by two and output the result to the phase comparator as the feedback clock, and the feedback clock of the phase locked circuit is used as the reference clock.

* * * * *